United States Patent
Wang

(10) Patent No.: US 7,902,673 B2
(45) Date of Patent: Mar. 8, 2011

(54) SEMICONDUCTOR DEVICE

(75) Inventor: Ying-Wei Wang, Hsinchu County (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 12/715,401

(22) Filed: Mar. 2, 2010

(65) Prior Publication Data
US 2010/0155948 A1 Jun. 24, 2010

Related U.S. Application Data

(62) Division of application No. 12/032,698, filed on Feb. 18, 2008, now Pat. No. 7,723,130.

(51) Int. Cl.
*H01L 23/48* (2006.01)
(52) U.S. Cl. ........ 257/776; 257/E23.142; 257/E21.636
(58) Field of Classification Search .......... 257/741, 257/E23.142, E21.636, E21.008, 908, 305, 257/773, 776, E21.628; 438/791, 758, 6, 438/383, 238, 200, 163
See application file for complete search history.

(56) References Cited

U.S. PATENT DOCUMENTS

| | | | |
|---|---|---|---|
| 5,699,299 A * | 12/1997 | Kim | 365/230.06 |
| 6,040,592 A | 3/2000 | McDaniel | |
| 6,171,732 B1 | 1/2001 | Chen | |
| 6,406,819 B1 | 6/2002 | Lin | |
| 6,531,393 B2 | 3/2003 | Huang | |
| 2007/0003127 A1 | 1/2007 | Nakano | |
| 2007/0034990 A1 | 2/2007 | Chen | |
| 2007/0117375 A1 | 5/2007 | Yang | |

* cited by examiner

*Primary Examiner* — Thomas L Dickey
*Assistant Examiner* — Nikolay Yushin
(74) *Attorney, Agent, or Firm* — Winston Hsu; Scott Margo

(57) ABSTRACT

A tooling method for fabricating semiconductor devices includes identifying two adjacent device lines having a device-to-device spacing width in an active region of a substrate, performing an operation to selectively define a first region as a region between the two adjacent device lines overlapping the active region, forming a first block pattern corresponding to the first region on a photomask when the device-to-device spacing width is equal to a predetermined value, and transferring the first block pattern to the substrate.

5 Claims, 7 Drawing Sheets

SEMICONDUCTOR DEVICE

CROSS REFERENCE TO RELATED APPLICATIONS

This application is a divisional of application Ser. No. 12/032,698 filed Feb. 18, 2008, and included herein by reference.

BACKGROUND OF THE INVENTION

1. Field of the Invention

The invention relates to a tooling method and a semiconductor device formed thereof, and more particularly, to a tooling method utilizing Boolean operations and a semiconductor device fabricated thereof.

2. Description of the Prior Art

Field effect transistors are important electronic devices in the fabrication of integrated circuits, and as the size of the semiconductor device shrinks, fabrications of the transistors and interconnects have to be improved for fabricating transistors with smaller sizes and higher quality.

Conventionally, after forming the transistors, contact plugs are often utilized for interconnection purposes, in which the contact plugs are composed of conducting metals such as tungsten or copper to electrically connect the gate, source, and drain to upper level interconnect layers. Furthermore, silicide layers are often formed over the surface of the gate structure and the source/drain region to improve the Ohmic contact between the contact plugs and the gate structure and the source/drain region. For example, a self-align silicide (salicide) process has been widely utilized to fabricate the silicide layers. The salicide process, after forming a salicide block (SAB) layer over non-salicide regions that are defined by a layout pattern according to a design rule provided from clients, includes steps of disposing a metal layer comprised of cobalt, titanium, or nickel on a source/drain region and a gate structure, and performing a rapid thermal process (RTP), thus the metal layer reacts with the silicon contained within the gate structure and the source/drain region to form a metal silicide.

As mentioned above, the salicide is utilized to reduce contact resistance of diffusion regions in typical logic circuits. However, inferior salicide formation sometimes happens due to incomplete metal layer formation between devices having too narrow device-to-device spacing and thereby inducing high leakage current and hence power supply current test (IDDQ test) failure. It is observed that this phenomenon usually and particularly happens at locations where the device-to-device spacing such as the poly-to-poly spacing is too narrow and without contact.

Therefore, a method capable of preventing abovementioned phenomenon and hence avoiding IDDQ test failure is needed.

SUMMARY OF THE INVENTION

It is therefore a primary objective of the claimed invention to provide a tooling method to prevent IDDQ failure.

According to the claimed invention, a tooling method for fabricating semiconductor devices is provided. The tooling method comprises steps of identifying two adjacent device lines having a device-to-device spacing width therebetween in an active region of a substrate; performing an operation to define a first region as a region between the two adjacent device lines overlapping the active region; forming a first block pattern corresponding to the first region on a photomask when the device-to-device spacing width is equal to a predetermined value; and transferring the first block pattern to the substrate to form the semiconductor device.

According to the claimed invention, a semiconductor device is provided. The semiconductor device comprises a substrate having at least an active region formed therein, at least two adjacent device lines formed without contact plugs positioned therebetween in the active region, and a non-salicide region defined between the two device lines.

Since the salicide layers are formed to reduce sheet resistance between elements, for instance, between the gate lines and the contact plugs, it is not necessary to form salicide on semiconductor devices without contact plugs. Furthermore, the incomplete salicide formed between the devices with too narrow device-to-device spacing often causes IDDQ failure. Therefore the tooling method provided by the present invention is utilized to exclude those locations where specific device-to-device spacing is too narrow. And thus the fabricated semiconductor device, which possesses no contact plugs or has too narrow device-to-device spacing between its adjacent device lines is formed without salicide layers for avoiding abovementioned problems.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
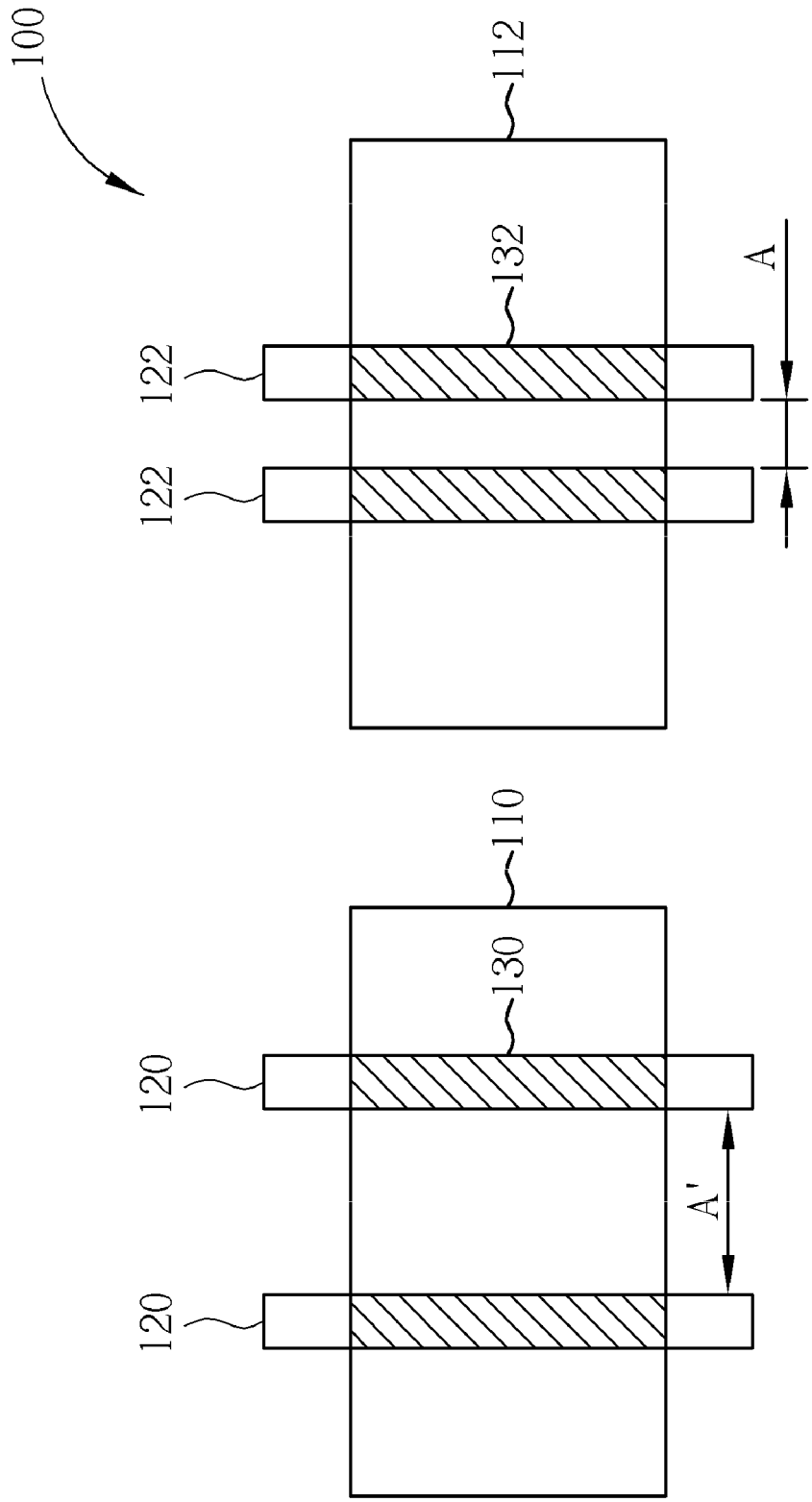
FIGS. 1-4 are schematic drawings illustrating a tooling method according to the present invention.

Please refer to FIGS. 1-4, which are schematic drawings illustrating the tooling method of the present invention. Please also refer to FIG. 5, which is a flow chart of the present invention. As shown in FIG. 1, a substrate 100 is provided with at least two device lines such as two gate lines 120 or two local polysilicon lines formed in an active region 110, and at least two local polysilicon lines 122 formed in an active region 112. Please note that the gate lines 120 in the active region 110 serve as comparison in the first preferred embodiment. The active regions 110 and 112 are doped regions. Before forming salicide layers on predetermined locations for reducing sheet resistance, a salicide block (SAB) layer (not shown) used to block non-salicide regions is formed in advance.

Next, a SAB photomask having a non-salicide region layout pattern according to a design rule from clients is provided for patterning the SAB layer. Furthermore, to avoid forming the salicide layers on locations where the device-to-device spacing is too narrow, which may cause incomplete metal formation and thus result inferior salicide formation, a tooling method provided by the present invention is utilized to exclude those locations where specific device-to-device spacing is too narrow.

Figure 4:
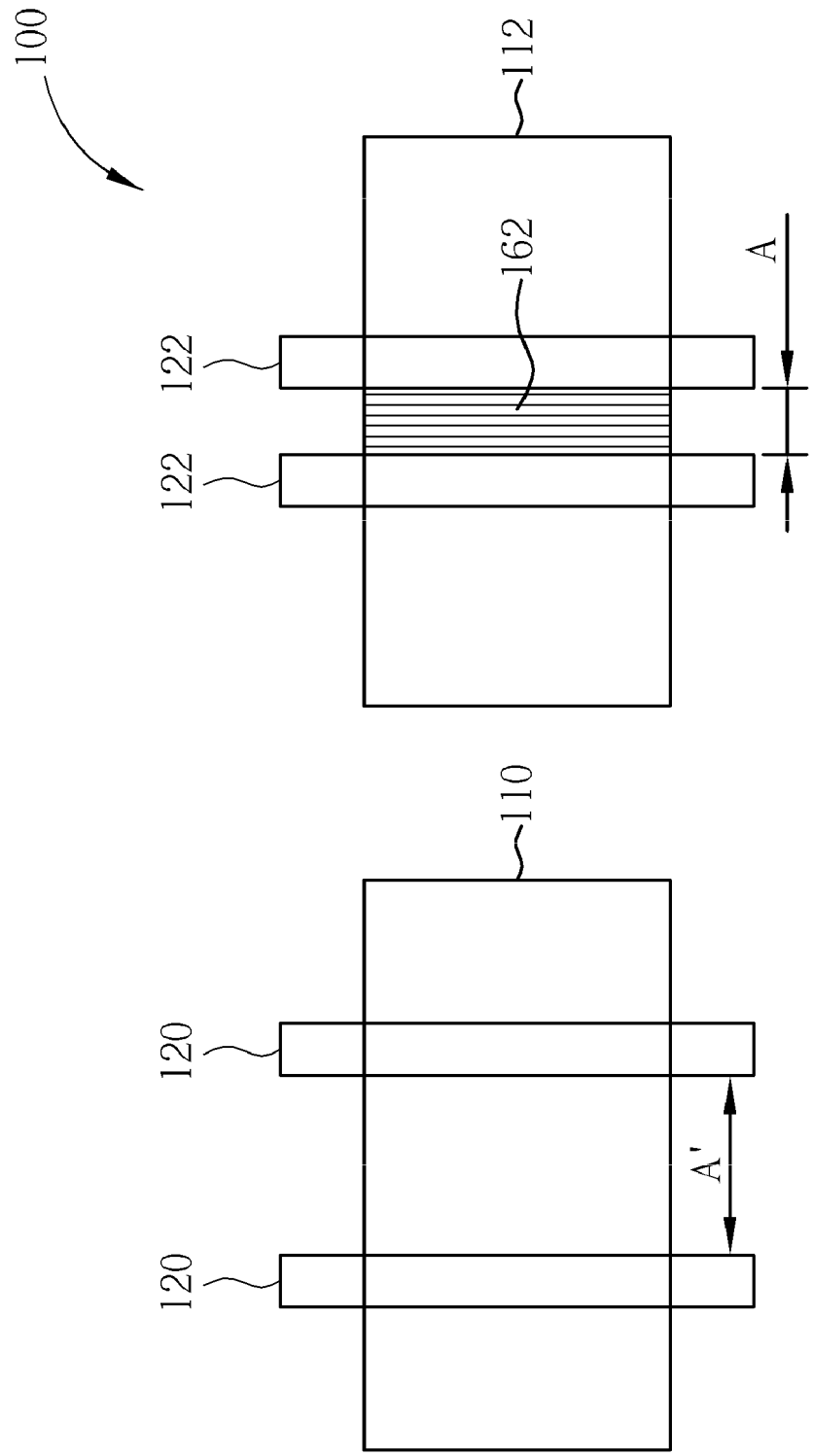
Figure 5:
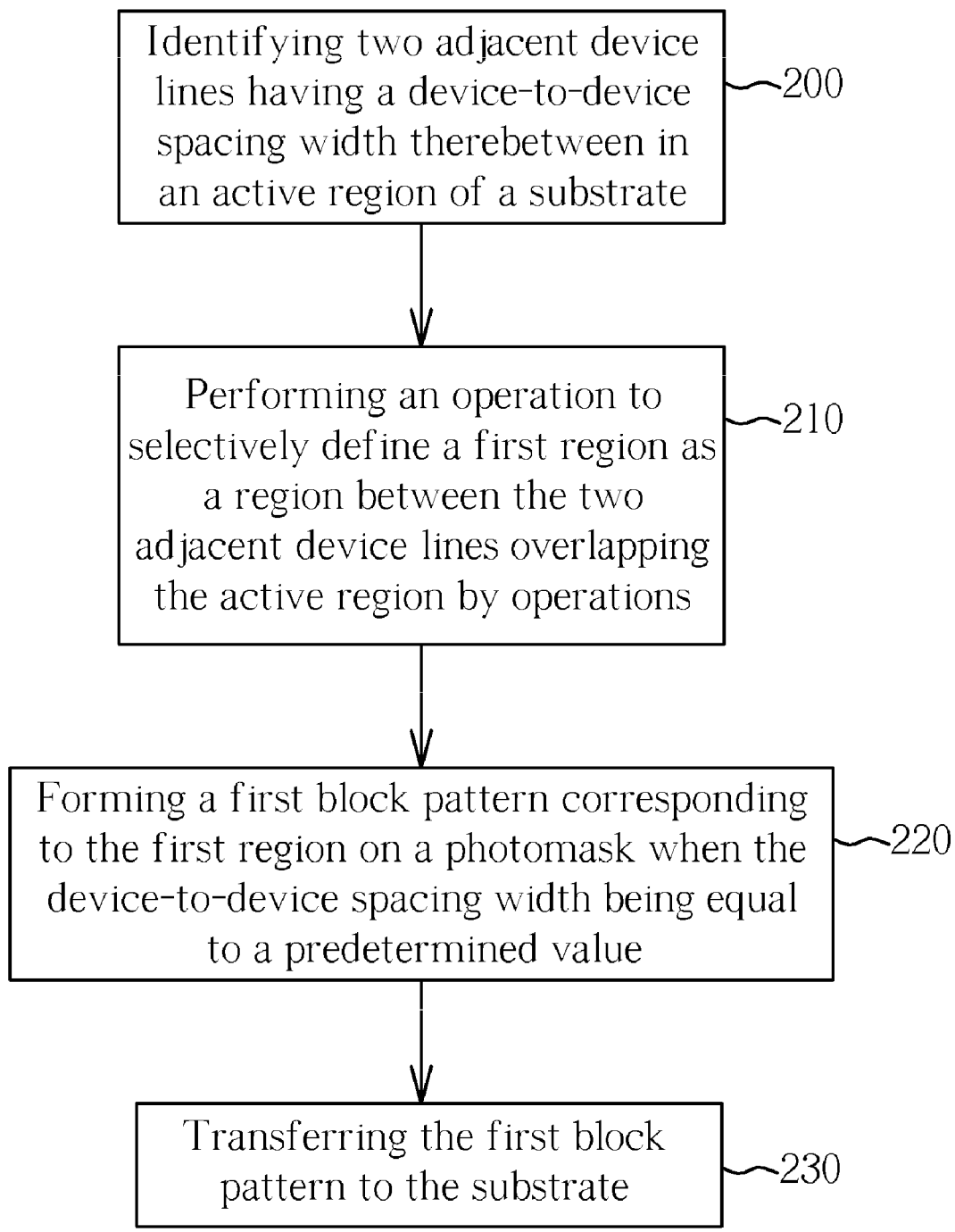
FIG. 5 is a flowchart of the tooling method according to the present invention.
Figure 6:
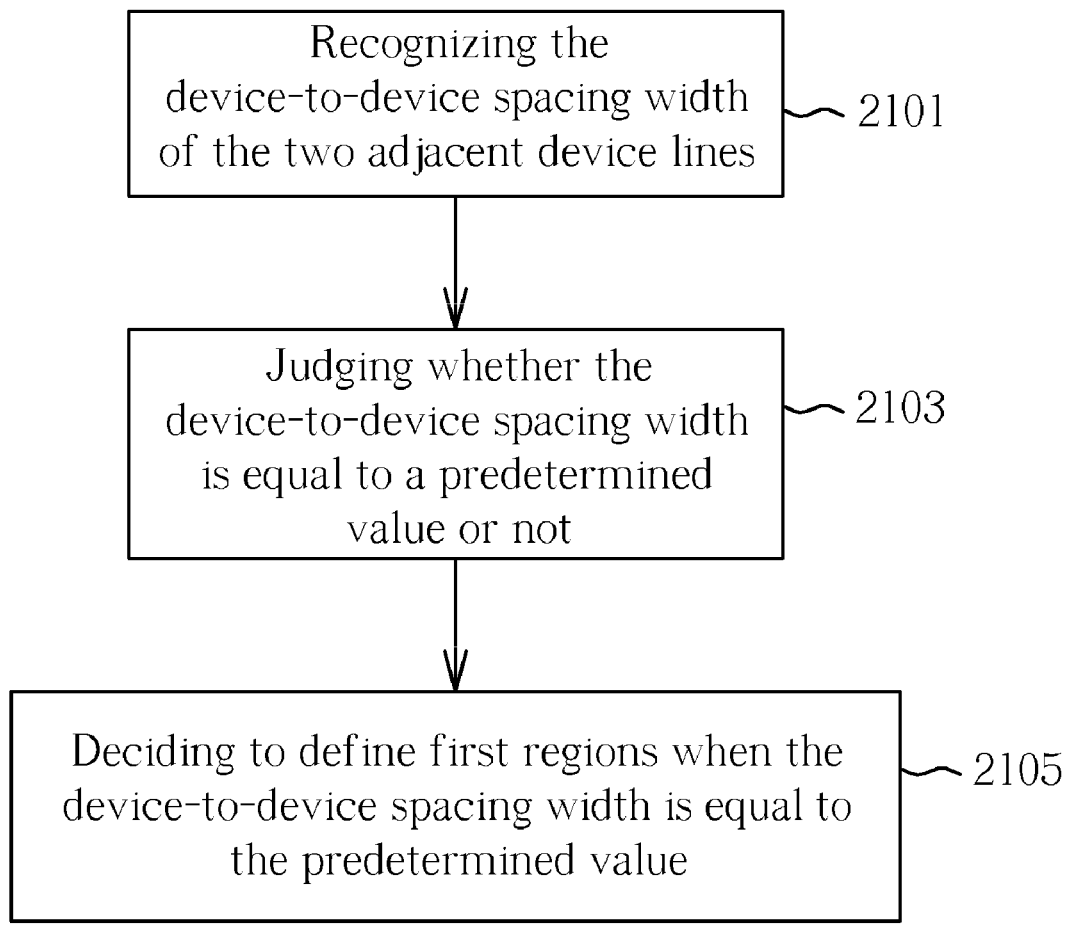
FIG. 6 is a flowchart of a first preferred embodiment of the present invention.

Please refer to FIGS. 1 and 5. According to the tooling method provided by the present invention, Step 200 is performed to identify two adjacent device lines having a deviceto-device width therebetween in an active region of a substrate. As shown in FIG. 1, the two adjacent gate lines 120 having a device-to-device spacing width A' and the two adjacent local polysilicon lines 122 having device-to-device spacing width A are identified. Then, Step 210 is performed to selectively define a first region as a region between the two adjacent device lines overlapping the active region by an operation. In the first preferred embodiment, the operation performed in Step 210 includes further steps, which are illustrated in FIG. 6. As shown in FIG. 6, Step 2101 is performed to recognize the device-to-device spacing width A of the two adjacent local polysilicon lines 122 and the device-to-device spacing width A' of the two adjacent gate lines 120. Then, Step 2103 is performed to judge whether the device-to-device spacing width A or A' is equal to a predetermined value "a" or not, and followed by performing Step 2105, which decides to define a first region 162 (shown in FIG. 4) when the device-to-device spacing width A or A' is equal to the predetermined value "a". The predetermined value "a" can be equal to or larger than the minimum rule. In the first preferred embodiment, the device-to-device spacing width A is equal to the predetermined value "a", therefore the first region 162 (shown in FIG. 4) is selectively defined as an overlapping region of the active region 112 between the two local polysilicon lines 122.

Please refer to FIGS. 4 and 5 again. Then, as described in Step 220, a first block pattern corresponding to the first region 162 is output and formed on a photomask when the device-to-device spacing width A is equal to the predetermined value "a". And according to Step 230 of the tooling method provided by the present invention, the first block pattern is then transferred to the substrate 100 by photolithography and etching process. That is, after photolithography process and etching process, a SAB layer is remained on the first region 162 of the substrate 100 according to the first block pattern, thereby avoiding the silicide formation in this first region 162 later.

Figure 7:
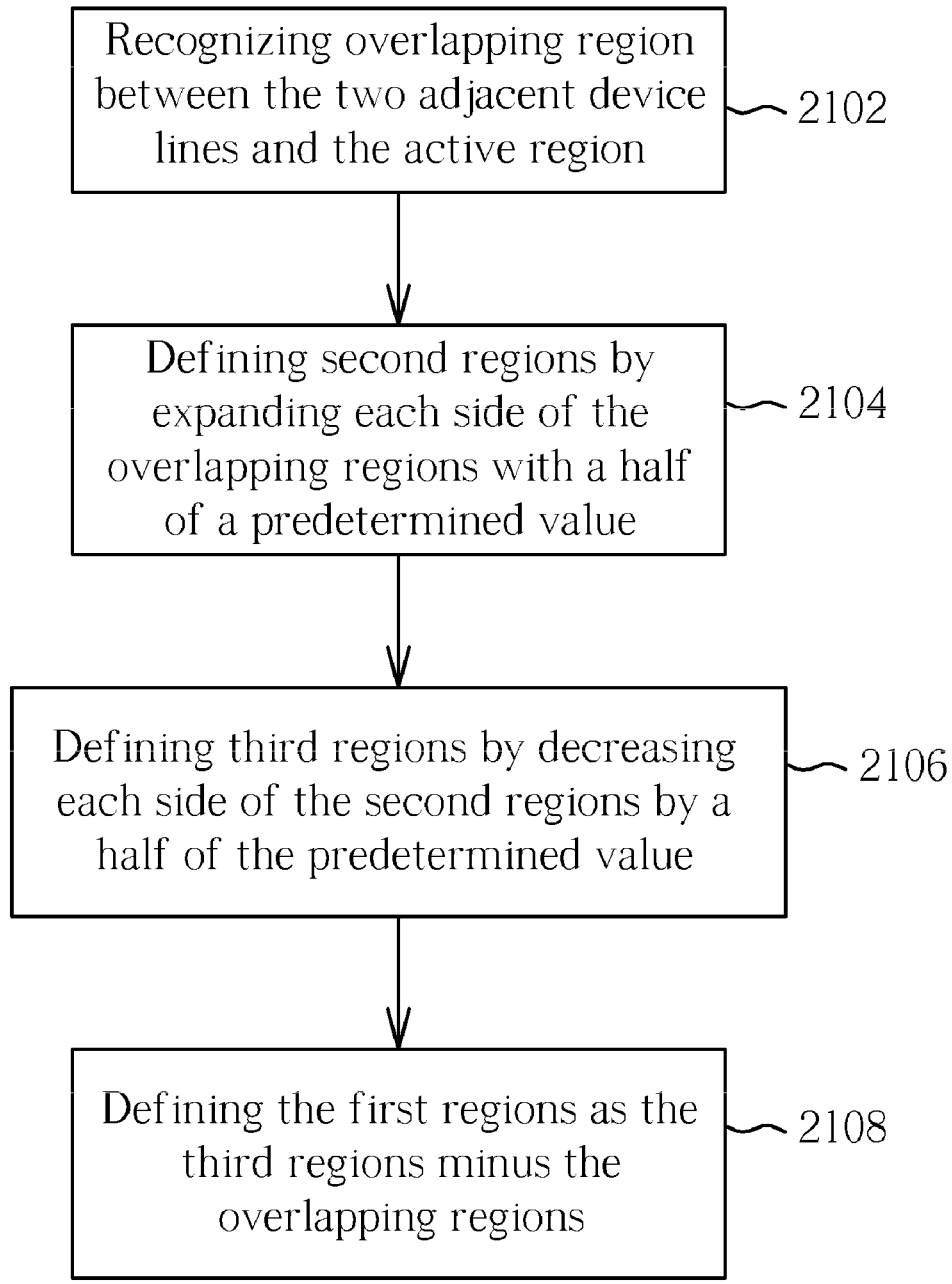
FIG. 7 is a flowchart of a second preferred embodiment of the present invention.

Please refer to FIGS. 1-5 again, and please also refer to FIG. 7, which is a flow chart of Step 210 according to the second preferred embodiment. In the second preferred embodiment, the operation of Step 210 includes further steps. As described in Step 2102, overlapping regions between the two adjacent lines and the active region are recognized respectively. Please also refer to FIG. 1, overlapping regions 130 between the gate lines 120 and the active region 110, and overlapping regions 132 between the local polysilicon lines 122 and the active region 112 are respectively recognized. According to the second preferred embodiment, a Boolean operation can be utilized for executing steps of the operation of the tooling method. For instance, the overlapping regions 130, 132 between the device lines 120, 122 and the active regions 110, 112 on the substrate 100 are assigned as a first Boolean variable: "SAB_TEMP 1" in the first Boolean operation step: "BOOLEAN 1". And "SAB_TEMP 1" which stands for "salicide block template" can be described as following:

BOOLEAN 1: SAB_TEMP 1=POLY AND DIFFUSION.

In BOOLEAN 1 operation step, "POLY" stands for "poly line" such as local polysilicon lines 122 or gate lines 120, and "DIFFUSION" stands for active regions such as regions 110 or 112, and "AND" is an operator, which means conjunction, known by a person skilled in the art.

Figure 2:
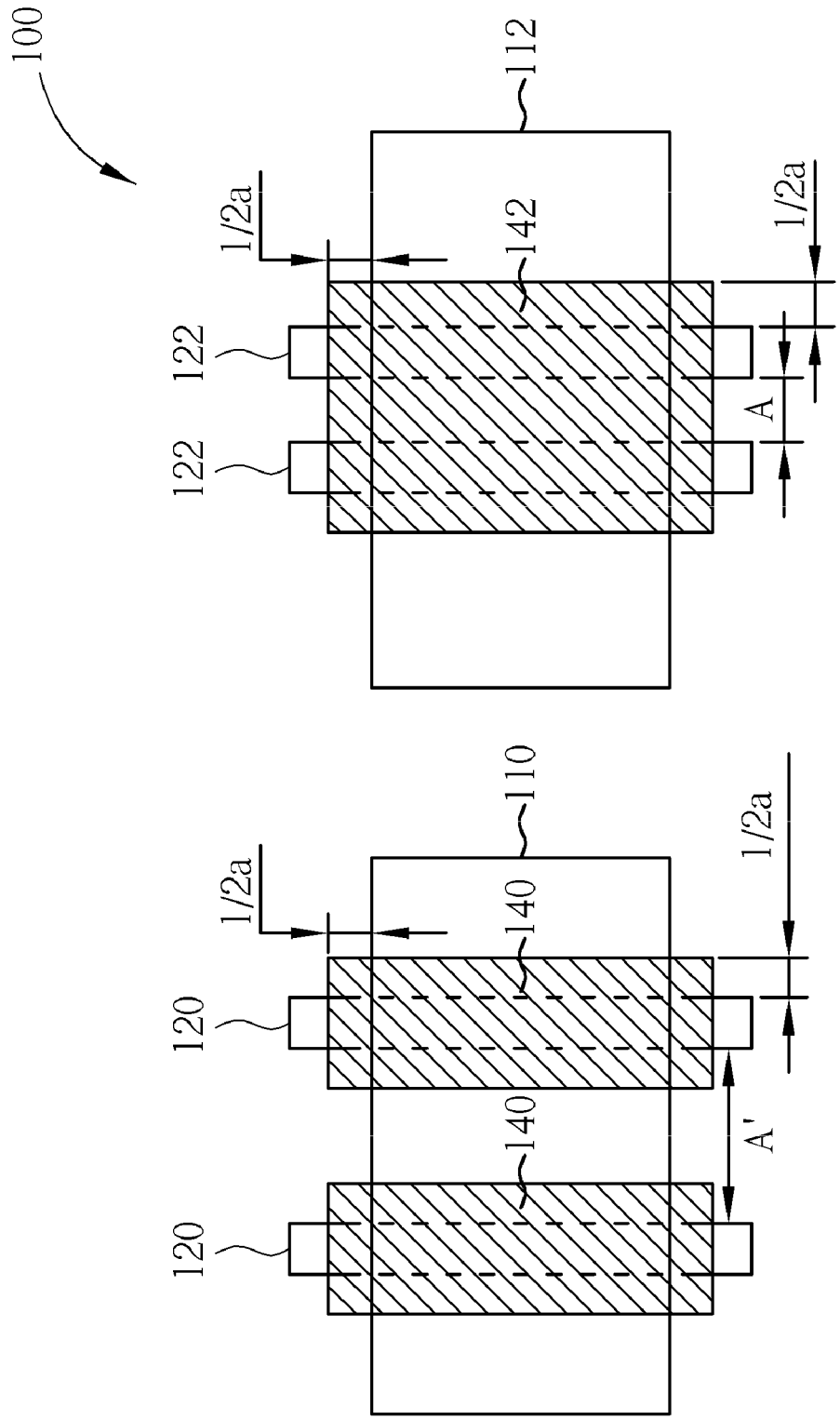

Please refer to FIG. 2 and Step 2104. Next, second regions 140 and 142 are defined by expanding each side of the overlapping regions 130 and 132 with a half of the predetermined value "a". The predetermined value "a" can be equal to or larger than the minimum rule. Definition for the second regions 140 and 142 is assigned as a second Boolean variable: "SAB_TEMP 2" in the second Boolean operation step "BOOLEAN 2", which is described as following:

BOOLEAN 2: SAB_TEMP 232 SAB_TEMP 130 (0.5a) µm/side

It is noteworthy that, as shown in FIG. 2, the device-to-device spacing width A of the local polysilicon lines 122 in the active region 112 is so narrow that the second regions 142 in the active region 112 merge with each other while the second regions 140 in the active region 110 do not contact with each other.

Figure 3:
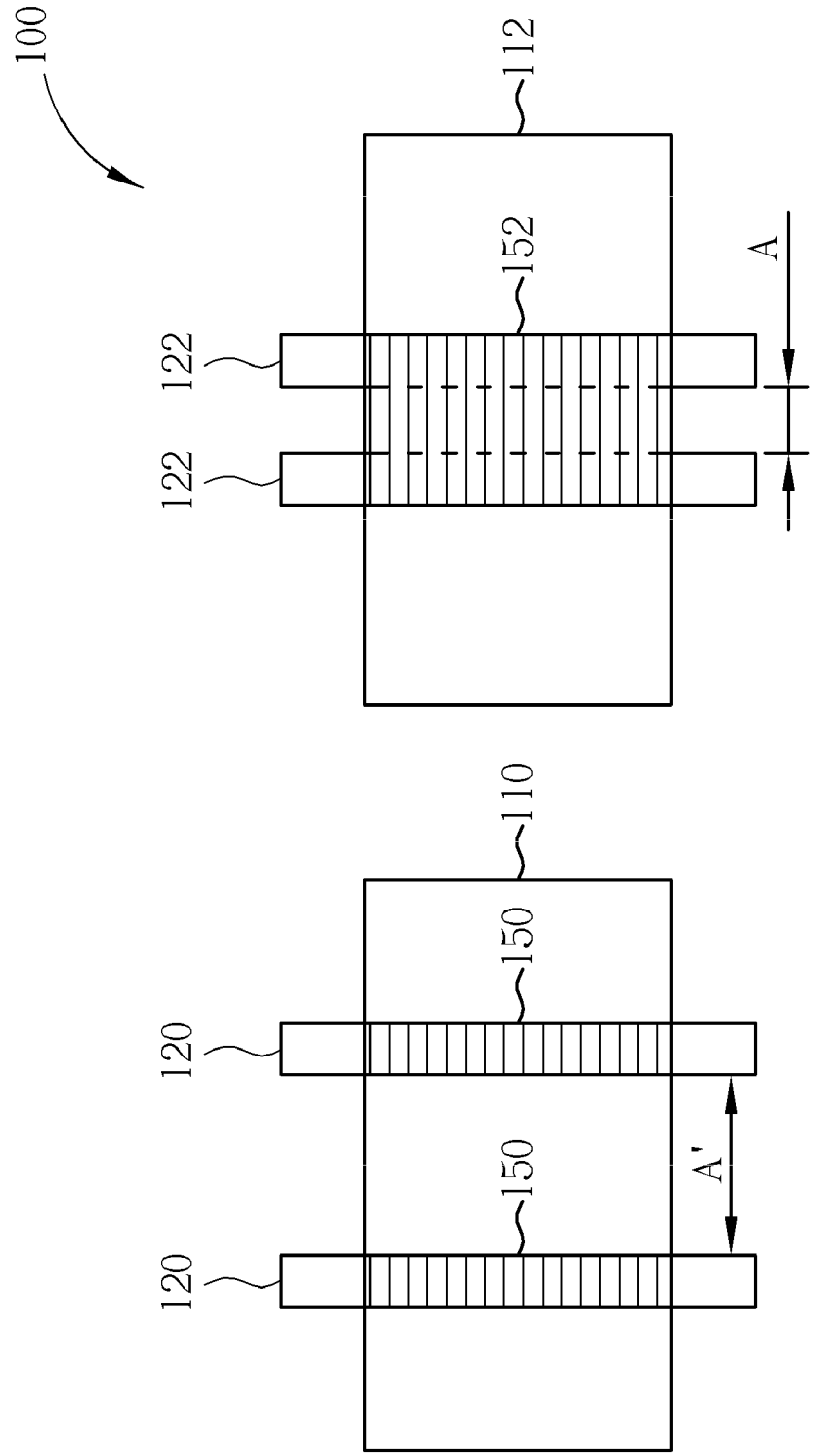

Please refer to FIG. 3 and Step 2106. Next, third regions 150 and 152 are defined by decreasing each side of the second regions 140 and 142 by a half of the predetermined value "a". Definition for the third regions 150 and 152 is assigned as a third Boolean variable: "SAB_TEMP 3" in the third Boolean operation step "BOOLEAN 3". And BOOLEAN 3 can be described as following:

BOOLEAN 3: SAB_TEMP 332 SAB_TEMP 2−(0.5a)µm/side

Please note that the resulted third region 152 in the active region 112 still covers spacing between the two polysilicon lines 122 while the third regions 150 in the active region 110 are remained as the overlapping regions 130, as shown in FIG. 3.

Please refer to FIG. 4 and Step 2108. Then a first region 162 is selectively defined between the two adjacent polysilicon lines 122 as the third regions 150 and 152 minus the overlapping regions 130 and 132. Definition for the first region 162 is assigned as a fourth Boolean variable: "SAB_TEMP 4" in the fourth Boolean operation step "BOOLEAN 4". And BOOLEAN 4 can be described as following:

BOOLEAN 4: SAB_TEMP 4=SAB_TEMP 3NOT SAB_TEMP 1

In BOOLEAN 4 operation step, "NOT" is an operator, which means negation, known by a person skilled in the art.

As mentioned above, since the third regions 150 in the active region 110 are identical with the overlapping regions 130, no region will be resulted in the active region 110 after BOOLEAN 4, as shown in FIG. 4.

Please refer to FIG. 5 again. Thereafter, first block patterns (not shown) corresponding to the first regions 162 are respectively defined on a photomask as described in Step 220. In the second preferred embodiment, the photomask is a SAB mask. It is noteworthy that Step 220, which is to form the first block pattern on the photomask, also can be a Boolean operation. The first block pattern and the SAB pattern according to a design rule provided by clients can be assigned as a fifth Boolean variable: "SAB_ON MASK" in the fifth Boolean operation step "BOOLEAN 5", which can be described as following:

BOOLEAN 5: SAB_ON MASK=SAB_TEMP 4 OR SAB

In BOOLRAN 5 operation step, "SAB_ON MASK" stands for the real SAB patterns on photomask, and "SAB" stands for the second block regions according to a design rule provided by the clients, and "OR" is an operator meaning disjunction.

According to the second preferred embodiment, Step 2102, Step 2104, Step 2106, Step 2108 and Step 220 can be respectively assigned as the first, the second, the third, the fourth, and the fifth Boolean operation steps as mentioned above.

And the 5 Boolean operation steps can be summarized as the following codes, but not limited thereto:

BOOLEAN 1: SAB_TEMP1=POLY AND DIFFUSION.

BOOLEAN 2: SAB_TEMP 2=SAB_TEMP 1+(0.5$a$) μm/side

BOOLEAN 3: SAB_TEMP 3=SAB_TEMP 2−(0.5$a$) μm/side

BOOLEAN 4: SAB_TEMP 4=SAB_TEMP 3 NOT SAB_TEMP 1

BOOLEAN 5: SAB_ON MSSK=SAB_TEMP 4 OR SAB

According to the tooling method provided by the present invention, regions between two adjacent device lines having device-to-device spacing width larger than the predetermined value are excluded from forming the first block pattern by the operation. In other words, the first block pattern corresponding to the first region is output and formed on the photomask when the device-to-device spacing width is equal to the predetermined value since such region is too narrow to form salicide layers satisfying requirements.

According to Step 230 of the tooling method provided by the present invention, the first block pattern is then transferred to a photoresist over the substrate 100 for patterning salicide blocking layer. Furthermore, in the first and second preferred embodiment, the photomask further includes a second block pattern, such as the SAB pattern mentioned above, formed according to a design rule provided by clients.

Please note that the gate lines 120 formed in the active region 110 serve as comparison for showing that device lines with device-to-device spacing larger than the predetermined value "a" will be excluded from forming the SAB layer by the tooling method. However, the second embodiment also provides a double verification that no first block pattern will be formed when the device-to-device spacing width of two adjacent device lines is larger than the predetermined value "a", because such region will be excluded by the operation as described in Steps 2102-2108.

Accordingly, the SAB layer, formed on the substrate 100 is patterned by the photomask possessing the first block patterns obtained from the tooling method of the present invention and the second block regions according to a design rule provided by the clients. Thus, the first region 162 between the two local polysilicon lines 122 is blocked by the SAB layer after the patterning. Consequently, a metal layer formed on the substrate 100 will not contact with the silicon material of the substrate 100. Thus salicide layer would not be formed on the sixth region 162 and IDDQ failure is prevented.

Please refer to FIG. 4 again. According to the tooling method, a semiconductor device is provided. The semiconductor device includes a substrate 100 having an active region 112 formed therein, and at least two device lines 122 with a device-to-device spacing width A formed in the active region 112. It is noteworthy that there is no contact plug positioned in between the two device lines 122. The provided semiconductor device further comprises a non-salicide region 162 defined in between the two device lines 122. According to the provided semiconductor device, when there are no contact plugs formed in between the two device lines 122, then no salicide is to be formed in between the two device lines 122. As mentioned above, since the salicide layers are formed to reduce sheet resistance between elements such as between the gate lines and the contact plugs, it is not necessary to form salicide on semiconductor devices that have no contact plugs formed between them. Furthermore, the incomplete salicide formed between the too narrow devices often causes IDDQ failure.

Therefore the semiconductor device, such as polysilicon lines or resistors, that possesses no contact plugs or has too narrow spacing width between its adjacent device is formed without salicide layers for avoiding abovementioned problems according to the tooling method of the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A Semiconductor device comprising:
a substrate having at least an active region formed therein;
at least two adjacent device lines formed without contact plugs positioned therebetween in the active region, wherein the two adjacent device lines have a minimum device-to-device spacing width therebetween; and
a non-salicide region defined between the two adjacent device lines.

2. The semiconductor device of claim 1, wherein the active region is a doped region.

3. The semiconductor device of claim 1, wherein the adjacent device lines are polysilicon lines.

4. The semiconductor device of claim 1, wherein the minimum device-to-device spacing width is equal to a design minimum rule of the device-to-device spacing width.

5. The semiconductor device of claim 1, wherein the minimum device-to-device spacing width is larger than a design minimum rule of the device-to-device spacing width.

* * * * *